United States Patent
Wu et al.

(10) Patent No.: US 7,453,127 B2
(45) Date of Patent: Nov. 18, 2008

(54) DOUBLE-DIFFUSED-DRAIN MOS DEVICE WITH FLOATING NON-INSULATOR SPACERS

(75) Inventors: Hua-Shu Wu, Hsinchu (TW); Feng-Chi Hung, Chu-Bei (TW); Hung-Lin Chen, Pingtung (TW); Shih-Chin Lee, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/352,791

(22) Filed: Feb. 13, 2006

(65) Prior Publication Data

US 2007/0187784 A1    Aug. 16, 2007

(51) Int. Cl.
*H01L 27/088* (2006.01)

(52) U.S. Cl. ........................ 257/401; 257/412
(58) Field of Classification Search ................ 257/412, 257/E29.3, E21.179, 401
See application file for complete search history.

(56) References Cited

U.S. PATENT DOCUMENTS

| | | | |
|---|---|---|---|
| 5,687,113 A * | 11/1997 | Papadas et al. ......... | 365/185.01 |
| 6,861,689 B2 | 3/2005 | Burnett | |
| 2004/0038461 A1* | 2/2004 | Lee et al. .................. | 438/142 |
| 2004/0219755 A1 | 11/2004 | Rabkin et al. | |
| 2004/0235305 A1 | 11/2004 | Lojek | |
| 2005/0051836 A1* | 3/2005 | Choi et al. ................ | 257/315 |
| 2005/0064671 A1 | 3/2005 | Hao et al. | |
| 2006/0073666 A1* | 4/2006 | Lim et al. ................. | 438/303 |
| 2006/0113627 A1* | 6/2006 | Chen et al. ................ | 257/500 |
| 2007/0001162 A1* | 1/2007 | Orlowski et al. ........... | 257/19 |

OTHER PUBLICATIONS

"Simple Gate-to-Drain Overlapped MOSFET's Using Poly Spacers for High Immunity to Channel Hot-Electron Degradation" Chen et al.; 1990; pp. 78-81.
"A Sub-Half Micron Partially Gate-to-Drain Overlapped MOSFET Optimized for High Performance and Reliability" Chen et al.; 1991; pp. 545-548.
TW Office Action mailed Apr. 2, 2008.

* cited by examiner

*Primary Examiner*—Allan R. Wilson
(74) *Attorney, Agent, or Firm*—Thomas, Kayden, Horstemeyer & Risley

(57) ABSTRACT

A double-diffused-drain metal-oxide-semiconductor device has a gate structure overlying a semiconductor substrate, a pair of insulator spacers on the sidewalls of the gate structure respectively, and a pair of floating non-insulator spacers embedded in the pair of insulator spacers respectively.

20 Claims, 1 Drawing Sheet

DOUBLE-DIFFUSED-DRAIN MOS DEVICE WITH FLOATING NON-INSULATOR SPACERS

TECHNICAL FIELD

The present invention relates to metal-oxide-semiconductor (MOS) devices, and particularly to a DDDMOS device having a floating non-insulator spacer.

BACKGROUND

A double-diffused-drain (DDD) is often used as a source or drain in a high-voltage (HV) metal-oxide-semiconductor field effect transistor (MOSFET) that is widely used for numerous power device applications. The DDD structure provides a high breakdown voltage for a HVMOSFET and prevents electrostatic discharge that may result in the destruction of a semiconductor device. A DDDMOS device is a typical power device to sustain the higher operating voltage, for example 10V-20V operating voltage. Hot-electron (HC) induced degradation is known as a serious reliability problem for the DDDMOS device. In a conventional DDDMOS device employing insulator spacers (e.g., silicon oxide or silicon nitride) on sidewalls of a polysilicon gate electrode, the HC effect causes serious degradation in transconductance ($G_m$) and saturation drain current ($I_{dsat}$). This is increasingly considered to be the most important limiting factor in scaling n-channel MOS transistors because of the higher channel electric field and electron impact ionization rate in micron and submicron n-channel devices.

SUMMARY OF THE INVENTION

Embodiments of the present invention include double-diffused-drain metal-oxide-semiconductor (DDDMOS) devices having floating non-insulator spacers to improve hot-carrier induced degradation immunity.

In one aspect, the present invention provides a high-voltage metal-oxide-semiconductor device. A gate structure is formed overlying a semiconductor substrate. A pair of insulator spacers is formed on the sidewalls of the gate structure respectively. A pair of floating non-insulator spacers is embedded in the pair of insulator spacers respectively. Each of the floating non-insulator spacers is insulated from the gate structure and the semiconductor substrate by the insulator spacer.

In another aspect, the present invention provides a double-diffused-drain metal-oxide-semiconductor device. A source region and a drain region are formed in a semiconductor substrate and spaced apart from each other. A gate structure is formed overlying the semiconductor substrate between the source region and the drain region. A pair of insulator spacers is formed on the sidewalls of the gate structure respectively. A pair of floating polysilicon spacers is embedded in the pair of insulator spacers respectively. A lightly doped drain (LDD) region is formed in the semiconductor substrate and extends laterally from the source region to one sidewall of the gate structure. A diffusion extending region is formed in the semiconductor substrate and surrounds the drain region.

In another aspect, the present invention provides a double-diffused-drain metal-oxide-semiconductor device. A source region and a drain region are formed in a semiconductor substrate and spaced apart from each other. A gate structure is formed overlying the semiconductor substrate between the source region and the drain region. A pair of insulator spacers is formed on the sidewalls of the gate structure respectively. A pair of floating polysilicon spacers is embedded in the pair of insulator spacers respectively. A first diffusion extending region is formed in the semiconductor substrate adjacent to one sidewall of the gate structure, and surrounds the source region. A second diffusion extending region is formed in the semiconductor substrate adjacent to the other sidewall of the gate structure, and surrounds the drain region.

BRIEF DESCRIPTION OF THE DRAWINGS

The aforementioned objects, features and advantages of this invention will become apparent by referring to the following detailed description of the preferred embodiments with reference to the accompanying drawings, wherein.

DETAILED DESCRIPTION OF ILLUSTRATIVE EMBODIMENTS

Figure 1:
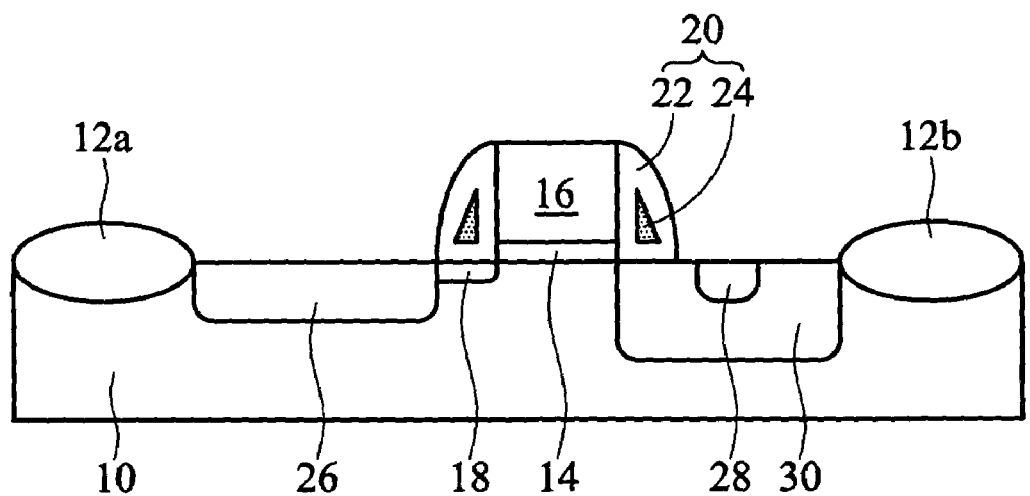
FIG. 1 is a cross-sectional diagram illustrating an exemplary embodiment of an asymmetric-type high-voltage DDDMOS device.

Embodiments of the present invention provide DDDMOS devices using a floating non-insulator spacer to improve hot-carrier induced degradation immunity for improving transconductance ($G_m$) and saturation drain current ($I_{dsat}$) and having advantages of shrinking its channel length. As used throughout this disclosure, the term "floating non-insulator spacer" refers to a floating structure formed of non-insulator materials, including, but not limited to, polysilicon, metal, conductive materials, or semiconductor materials, and embedded in an insulator spacer at one sidewall of a gate electrode of the DDDMOS device. This DDDMOS device with the floating non-insulator spacer is used in high-voltage device applications. As used throughout this disclosure, the term "high-voltage device" refers to a MOS transistor operating at a power supply voltage greater than 5V, typically within the range of 10V to 80V. The invention has wide applicability to many manufacturers, factories and industries, including, but not limited to, integrated circuit fabrications, microelectronic fabrications, and optical electronic fabrications for numerous high-voltage applications, such as LCD driver ICs, power management devices, power supplies, non-volatile memories, communication circuits, and control circuits. The invention may adopt LOCOS (local oxidation of silicon) isolation technique or STI (shallow trench isolation) technique to fabricate either asymmetric-type high-voltage DDDMOS transistors or symmetric-type high-voltage DDDMOS transistors. Although implementations of the present invention are described herein with specific reference to a DDD MOS device, it is to be appreciated that the techniques of the present invention are similarly applicable to other devices, such as, but not limited to, an lateral diffused metal-oxide-semiconductor (LDMOS) device, a vertical diffused lateral diffused metal-oxide-semiconductor (VDMOS) device, an extended drain MOS device, etc., with or without modifications thereto, as will be understood by those skilled in the art.

Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

Herein, a cross-section diagram of FIG. 1 illustrates an exemplary embodiment of an asymmetric-type high-voltage DDDMOS device. The asymmetric-type DDDMOS device comprises two isolation regions 12a and 12b formed in a semiconductor substrate 10 to define the active area of the high-voltage device region. The semiconductor substrate 10 includes, but is not limited to, silicon, silicon on insulator (SOI), SiGe on insulator, or combinations thereof. The isolation regions 12a and 12b, such as field oxide regions, may be created with conventionally well-known LOCOS isolation technique, and therefore a description thereof will be omitted.

A gate structure comprising a gate dielectric layer 14 and a gate electrode layer 16 is formed over a portion of the active area of the semiconductor substrate 10, which may use conventional deposition, lithographic patterning and dry etching methods known in the art. The gate dielectric layer 14 may be formed of silicon oxide, silicon oxynitride, silicon nitride, high-k dielectrics (e.g., k>4.0), transition metal oxides, and rare earth metal oxides by using any process known in the art, e.g., thermal oxidation and chemical vapor deposition (CVD). The thickness of the gate dielectric layer 14 is chosen specifically for the scaling requirements of the high-voltage device technology. The gate electrode layer 16 may be formed of polysilicon, amorphous polysilicon, doped polysilicon, polysilicon-germanium, metal, or combinations thereof by using CVD, sputtering or thermal growth processes.

A lightly doped ion implantation process is performed with various dopant species into the semiconductor substrate 10 to form an LDD (lightly doped drain) region 18. The margin of the LDD region 18 is substantially aligned to one sidewall of the gate structure. The lightly doped ion implantation process may be performed at energy between about 1 to about 100 KeV, at dosage of between about $1 \times 10^{13}$ to about $1 \times 10^{15}$ ions/cm$^2$.

Advances in deposition, lithography, masking techniques and dry etch processes are followed to form composite spacer structures 20 along the sidewalls of the gate structure. Each composite spacer structure 20 includes an insulator spacer 22 and a floating non-insulator spacer 24 embedded in the insulator spacer 22. That is, the floating non-insulator spacer 24 is a floating structure, being isolated from the gate structure and the underlying diffusion region by the insulator spacer 22. The floating non-insulator spacer 24 may be formed of polysilicon, amorphous polysilicon, doped polysilicon, polysilicon-germanium, metal, other conductive materials or semiconductor materials. The insulator spacer 22 may be formed of silicon oxide, silicon nitride, a silicon oxynitride layer, alternating layers of silicon oxide and silicon nitride, or combinations thereof.

A heavily doped ion implantation process is then performed and the composite spacer structures 20 are used as the mask to implant various dopant species into the semiconductor substrate 10, resulting in heavily doped regions functioned as a source region 26 and a drain region 28 in the substrate 10. The margin of the source region 26 is substantially aligned to the exterior sidewall of the composite spacer structure 20, and the drain region 28 is separated from the drain side of gate structure by an appropriate distance. The heavily doped ion implantation process may be performed at energy between about 1 to 100 KeV, at dosage between about $5 \times 10^{13}$ to $1 \times 10^{16}$ ions/cm$^2$.

A diffusion extension region 30, adjacent to the drain side of the gate structure, surrounds the drain region 28 to construct a double-diffused-drain (DDD) region. The diffusion extension region 30 has a relatively larger area with a relatively light dosage, and the drain region 28 has a relatively smaller area with a relatively heavy dosage. Whether a transistor is NMOS or PMOS will depend on the conductivity type of the substrate and the source/drain regions. As based for an NMOS transistor, the diffusion extension region 30 is an N region with a dosage of about $6.0 \times 10^{12}$ ions/cm$^2$ to $9.0 \times 10^{12}$ ions/cm$^2$, and the drain region 28 and the source region 26 are N$^+$ regions with a dosage of about $5 \times 10^{13}$ to $1 \times 10^{16}$ ions/cm$^2$. As based for a PMOS transistor, the diffusion extending region 30 is a P region with a dosage of about $6.0 \times 10^{12}$ ions/cm$^2$ to $9.0 \times 10^{12}$ ions/cm$^2$, the drain region 28 and the source region 26 are P$^+$ regions with a dosage of about $5 \times 10^{13}$ to $1 \times 10^{16}$ ions/cm$^2$.

An optional metal silicide layer using a refractory metal such as cobalt, tungsten, titanium, nickel or the like may be formed on the surface of the gate electrode layer 16, the surface of the source region 26 and the surface of the drain region 28 to lower their resistance values. The metal silicide layer is omitted in the Figures for simplicity and clarity.

In the asymmetric-type DDDMOS device by the use of the floating non-insulator spacer 24, location of the maximum electric field moves from the gate dielectric edge (e.g., a portion adjacent to the insulator spacer) to the gate dielectric bottom (e.g., a portion away from the edge portion toward the center of the gate electrode layer), thus hot-carrier degradation immunity is significantly improved. Compared with the conventional DDD NMOS device with insulator spacers, in the exemplary embodiment of the DDD NMOS device with the floating non-insulator spacers after a stress time (about 5 minutes) by experiments, $G_m$ degradation is improved from 1.8% to 0.95% and $I_{dsat}$ degradation is improved from 15% to 8%.

Figure 2:
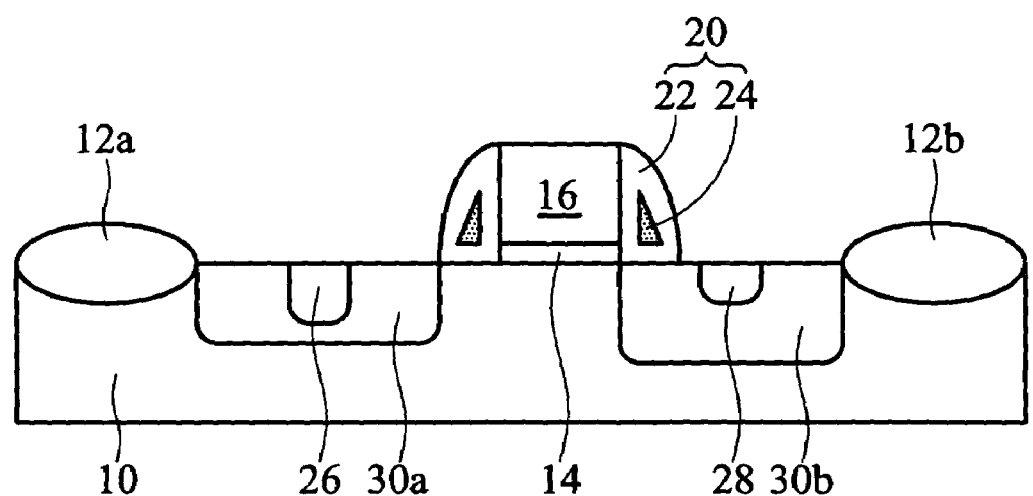
FIG. 2 is a cross-sectional diagram illustrating an exemplary embodiment of a symmetric-type high-voltage DDDMOS device.

FIG. 2 is a cross-sectional diagram illustrating an exemplary embodiment of a symmetric-type high-voltage DDDMOS device according to the present invention, while explanation of the same or similar portions to the description in FIG. 1 will be omitted. Compared with the asymmetric-type DDDMOS device, the symmetric-type DDDMOS device comprises two separated diffusion extension regions 30a and 30b between the two isolation regions 12a and 12b. The diffusion extension region 30a, adjacent to the source side of the gate structure, surrounds the source region 26 to construct a double diffused source region. Symmetrically, the diffusion extension region 30b, adjacent to the drain side of the gate structure, surrounds the drain region 28 to construct a double diffused drain region. Particularly, the floating non-insulator spacer 24 embedded in the insulator spacer 22 can move location of the maximum electric field from the gate dielectric edge to the gate dielectric bottom, thus hot-carrier degradation immunity is significantly improved to improve transconductance ($G_m$) and saturation drain current ($I_{dsat}$).

Although the present invention has been described in its preferred embodiments, it is not intended to limit the invention to the precise embodiments disclosed herein. Those skilled in this technology can still make various alterations and modifications without departing from the scope and spirit of this invention. Therefore, the scope of the present invention shall be defined and protected by the following claims and their equivalents.

What is claimed is:

1. A high-voltage metal-oxide-semiconductor device, comprising:
 a gate structure overlying a semiconductor substrate;
 a pair of insulator spacers on the sidewalls of said gate structure respectively;
  wherein the height of the pair of insulator spacers is less than or equal to the height of the gate structure;
 a pair of floating non-insulator spacers enrolled within said pair of insulator spacers respectively such that the height of the floating non-insulator spacers is less than that of the gate structure, wherein each of said floating non-insulator spacers is insulated from said gate structure and said semiconductor substrate by said insulator spacer, and said gate structure does not overlap said insulator spacers and said floating non-insulator spacers;
 a first diffusion extension region with one end aligned with one sidewall of said gate structure and the other end aligned with a field oxide region formed in said semiconductor substrate;
 a drain region in said diffusion extension region,
 wherein a distinct dosage difference exists between said first diffusion extension region and said drain region to construct a double-diffused-drain (DDD) region.

2. The high-voltage metal-oxide-semiconductor device of claim 1, wherein said floating non-insulator spacer comprises polysilicon.

3. The high-voltage metal-oxide-semiconductor device of claim 1, wherein said floating non-insulator spacer comprises metal, conductive materials, semiconductor materials or combinations thereof.

4. The high-voltage metal-oxide-semiconductor device of claim 1, wherein said insulator spacer comprises silicon oxide, silicon nitride, silicon oxynitride, or combinations thereof.

5. The high-voltage metal-oxide-semiconductor device of claim 1, further comprising:
 a source region and a drain region formed in said semiconductor substrate and spaced apart from each other, wherein said gate structure is disposed between said source region and said drain region; and
 a single lightly doped drain (LDD) region formed in said semiconductor substrate and extending laterally from said source region to one sidewall of said gate structure.
 wherein said source region and said drain region have different doped depths respectively.

6. The high-voltage metal-oxide-semiconductor device of claim 1, wherein said drain region and said diffusion extending region have the same conductive type, and said drain region has an ion-doped concentration greater than that of said diffusion extending region.

7. The high-voltage metal-oxide-semiconductor device of claim 1, further comprising two isolation regions in said semiconductor substrate, wherein said source region, said drain region and said diffusion extending region are formed between said two isolation regions.

8. The high-voltage metal-oxide-semiconductor device of claim 1, further comprising:
 a source region and a drain region formed in said semiconductor substrate and spaced apart from each other, wherein said gate structure is disposed between said source region and said drain region;
 a second diffusion extending region formed in said semiconductor substrate adjacent to one sidewall of said gate structure, and surrounding said source region;
 wherein a distinct dosage difference exists between said second diffusion extension region and said source region to construct a double-diffused-drain (DDD) region, and
 wherein said source region and said drain region have different doped depths respectively.

9. The high-voltage metal-oxide-semiconductor device of claim 8, wherein said source region and said first diffusion extending region have the same conductive type, and said source region has an ion-doped concentration greater than that of said first diffusion extending region.

10. The high-voltage metal-oxide-semiconductor device of claim 8, wherein said drain region and said second diffusion extending region have the same conductive type, and said drain region has an ion-doped concentration greater than that of said second diffusion extending region.

11. The high-voltage metal-oxide-semiconductor device of claim 8, further comprising two isolation regions in said semiconductor substrate, wherein said source region, said drain region, said first diffusion extending region and said second diffusion extending region are formed between said two isolation regions.

12. A double-diffused-drain metal-oxide-semiconductor device, comprising:
 a source region and a drain region formed in a semiconductor substrate and spaced apart from each other;
 a gate structure overlying said semiconductor substrate between said source region and said drain region;
 a pair of insulator spacers on the sidewalls of said gate structure respectively;
 wherein the height of the pair of insulator spacers is less than or equal to the height of the gate structure;
 a pair of floating polysilicon spacers embedded in said pair of insulator spacers respectively such that the height of the floating non-insulator spacers is less than that of the gate structure, wherein said gate structure does not overlap said insulator spacers and said floating polysilicon spacers;
 a single lightly doped drain (LDD) region formed in said semiconductor substrate and extending laterally from said source region to one sidewall of said gate structure; and
 a diffusion extending region with one end aligned with one sidewall of said gate structure and the other end aligned with a field oxide region formed in said semiconductor substrate and surrounding said drain region.
 wherein a distinct dosage difference exists between said diffusion extension region and said drain region to construct a double-diffused-drain (DDD) region.

13. The double-diffused-drain metal-oxide-semiconductor device of claim 12 wherein said insulator spacer comprises silicon oxide, silicon nitride, silicon oxynitride, or combinations thereof.

14. The double-diffused-drain metal-oxide-semiconductor device of claim 12, wherein said drain region and said diffusion extending region have the same conductive type, and said drain region has an ion-doped concentration greater than that of said diffusion extending region.

15. The double-diffused-drain metal-oxide-semiconductor device of claim 12, further comprising two isolation regions in said semiconductor substrate, wherein said source region, said drain region and said diffusion extending region are formed between said two isolation regions.

16. A double-diffused-drain metal-oxide-semiconductor device, comprising:
 a source region and a drain region formed in a semiconductor substrate and spaced apart from each other;

a gate structure overlying said semiconductor substrate between said source region and said drain region;

a pair of insulator spacers on the sidewalls of said gate structure respectively, wherein the height of the pair of insulator spacers is less than or equal to the height of the gate structure;

a pair of floating polysilicon spacers enrolled within said pair of insulator spacers respectively, such that the height of the floating non-insulator spacers is less than that of the gate structure, wherein said gate structure does not overlap said insulator spacers and said floating polysilicon spacers;

a first diffusion extending region with one end aligned with one sidewall of said gate structure and the other end aligned with a field oxide region formed in said semiconductor substrate, and surrounding said source region; and a second diffusion extending region formed in said semiconductor substrate adjacent to the other sidewall of said gate structure, and surrounding said drain region;

wherein a distinct dosage difference exists between said first diffusion extension region, and wherein a distinct dosage difference exists between said second diffusion extension region and said drain region to construct a double-diffused-drain (DDD) region.

17. The double-diffused-drain metal-oxide-semiconductor device of claim 16, wherein said insulator spacer comprises silicon oxide, silicon nitride, silicon oxynitride, or combinations thereof.

18. The double-diffused-drain metal-oxide-semiconductor device of claim 16, wherein said source region and said first diffusion extending region have the same conductive type, and said source region has an ion-doped concentration greater than that of said first diffusion extending region.

19. The double-diffused-drain metal-oxide-semiconductor device of claim 16, wherein said drain region and said second diffusion extending region have the same conductive type, and said drain region has an ion-doped concentration greater than that of said second diffusion extending region.

20. The double-diffused-drain metal-oxide-semiconductor device of claim 16, further comprising two isolation regions in said semiconductor substrate, wherein said source region, said drain region, said first diffusion extending region and said second diffusion extending region are formed between said two isolation regions.

* * * * *